US009024326B2

(12) United States Patent
Actis et al.

(10) Patent No.: US 9,024,326 B2
(45) Date of Patent: May 5, 2015

(54) METHOD AND DESIGN OF AN RF THRU-VIA INTERCONNECT

(75) Inventors: Robert Actis, Burlington, MA (US); Pane-chane Chao, Nashua, NH (US); Robert J. Lender, Jr., Pepperell, MA (US); Kanin Chu, Nashua, NH (US); Bernard J. Schmanski, Merrimack, NH (US); Sue May Jessup, Windham, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 111 days.

(21) Appl. No.: 13/879,696

(22) PCT Filed: Jul. 18, 2012

(86) PCT No.: PCT/US2012/047135
§ 371 (c)(1),
(2), (4) Date: Apr. 16, 2013

(87) PCT Pub. No.: WO2013/055423
PCT Pub. Date: Apr. 18, 2013

(65) Prior Publication Data
US 2013/0341644 A1    Dec. 26, 2013

Related U.S. Application Data

(60) Provisional application No. 61/508,799, filed on Jul. 18, 2011.

(51) Int. Cl.
*H01L 29/15* (2006.01)
*H01L 23/373* (2006.01)
*H01L 23/66* (2006.01)
*H01L 23/48* (2006.01)

(52) U.S. Cl.
CPC ............ *H01L 23/373* (2013.01); *H01L 23/481* (2013.01); *H01L 23/66* (2013.01); *H01L 2223/6622* (2013.01); *H01L 2223/6627* (2013.01); *H01L 2924/10272* (2013.01); *H01L 2924/1033* (2013.01); *H01L 2924/1421* (2013.01); *H01L 2924/30111* (2013.01); *H01L 2224/4847* (2013.01); *H01L 2924/3011* (2013.01)

(58) Field of Classification Search
CPC ...... H01L 23/373; H01L 23/481; H01L 23/66
USPC ....................... 257/76, 77; 438/584
See application file for complete search history.

(56) References Cited

U.S. PATENT DOCUMENTS

| | | |
|---|---|---|
| 5,057,798 A | 10/1991 | Moye et al. |
| 6,301,122 B1 * | 10/2001 | Ishikawa et al. ............. 361/794 |
| 6,362,703 B1 | 3/2002 | Keesey et al. |

(Continued)

*Primary Examiner* — Trung Q Dang
(74) *Attorney, Agent, or Firm* — Daniel J. Long (57) ABSTRACT

In summary, a vertical metalized transition in the form of a via goes from the back side of a high thermal conductivity substrate and through any semiconductor layers thereon to a patterned metalized strip, with the substrate having a patterned metalized layer on the back side that is provided with a keep away zone dimensioned to provide impedance matching for RF energy coupled through the substrate to the semiconductor device while at the same time permitting the heat generated by the semiconductor device to flow through the high thermal conductivity substrate, through the back side of the substrate and to a heat sink.

18 Claims, 8 Drawing Sheets

(56) References Cited

U.S. PATENT DOCUMENTS

| | | |
|---|---|---|
| 6,377,464 B1 * | 4/2002 | Hashemi et al. ............ 361/760 |
| 2002/0055265 A1 | 5/2002 | Ring |
| 2005/0023656 A1 | 2/2005 | Leedy |
| 2006/0092079 A1 | 5/2006 | de Rochemont |
| 2009/0108437 A1 | 4/2009 | Raymond |
| 2010/0225539 A1 | 9/2010 | Margomenos et al. |
| 2011/0291111 A1 * | 12/2011 | Nagai et al. ............ 257/77 |

* cited by examiner

MERFS Metal

*Fig. 7*

GaN Backside Metal

METHOD AND DESIGN OF AN RF THRU-VIA INTERCONNECT

RELATED APPLICATIONS

This Application claims rights under 35 USC § 119(e) from U.S. application Ser. No. 61/508,799 filed Jul. 18, 2011, the contents of which are incorporated herein by reference.

STATEMENT OF GOVERNMENT INTEREST

The invention was made with United States Government assistance under contract no. W15P7T-07-C-P437 awarded by the US Army. The United States Government has certain rights in the invention.

FIELD OF THE INVENTION

This invention relates to semiconductor connections and more specifically to a vertical via through a silicon carbide substrate for coupling RF energy through the silicon carbide substrate and a gallium nitride layer to a contact pad on the gallium nitride to take advantage of the high thermal conductivity heat dissipating capability of silicon carbide for high power amplifiers without having to use wire bond connections for the RF energy.

BACKGROUND OF THE INVENTION

In the past microwave devices such as Monolithic Microwave Integrated Circuits (MMICs) have been utilized in a wide variety of RF power amplifier applications and more specifically in the military for towed or expendable jammers that use a large number of wideband high power solid-state amplifying devices. Such amplifiers and their applications are discussed in U.S. Pat. Nos. 7,924,097 and 8,076,975 issued to Robert Actis et al., assigned to the assigned hereof and incorporated by reference. In these devices multiple transistors are placed on a substrate and in general each generate 2 watts of RF power with an associated 2 watts of DC power that must be dissipated. The problem when large numbers of high power transistors are used in amplifiers is the ability of the substrate to dissipate the heat that is generated, generally at the gate electrodes of the high power transistors.

It has been found that the silicon carbide host substrate of GaN transistors with its high thermal conductivity provides an excellent way of transferring the heat away from the vicinity of the gate electrode to a heat sink, whereby the approximate 2 watts of waste heat that is generated in the operation of the power transistor is effectively dissipated.

High power gallium nitride transistors commonly have their gallium nitride layer on top of a silicon carbide substrate, the bottom of which is metalized and in contact with a heat sink that provides an excellent thermal ground plane structure for an array of high power MMIC RF amplifiers.

The problem with such amplifiers is the fact that the RF energy is applied to or coupled out of the transistor utilizing wire bonds. However, wire bonding techniques are non-optimal due to discontinuities at the points of the attachment of the wire bond where power is lost and reliability is sacrificed. Aside from the awkwardness of having to provide a number of wire bonds, the associated parasitics of multiple wire bonds limits the usable bandwidth performance of the wideband amplifying MMICs.

Thus, while silicon carbide as a substrate has excellent thermal conductivity to be able to dissipate the heat in the vicinity of the gate structure for high power transistors, the use of wire bonds to contact the gallium nitride transistors make the use of these wire bonded high power amplifiers less desirable from an optimal power-bandwidth performance perspective.

It will be noted that in these types of devices the power level for each individual 400 micron device with a power density of 5 watts per millimeter results in the generation of 2 to 3 watts of RF power. When 40-90 of these individual devices are placed in a circuit, the amount of heat that must be dissipated is for instance 90 times that associated with a single one of these devices. While the heat associated with the above devices is associated with RF power, one nonetheless has to dissipate DC currents, and for a 50% efficient device, one needs for instance to dissipate 2 watts of waste heat for every 2 watts of RF output power.

In order to be able to use the GaN on silicon carbide semiconductor technology, it has been suggested to utilize a flip chip die attach approach which is a very cost effective technique for connecting to integrated circuits.

However, when amplifiers in the form of MMICs are to be connected utilizing solder balls and flip chip attachment techniques, there is a problem because when the chip is flipped upside down such that the silicon carbide base now has a top surface open to the air, all of the heat dissipated through the silicon carbide has nowhere to go as there is no heat sink available at this top surface of the silicon carbide. It is noted that power flip chip components may have additional solder pads or metal bumps in the vicinity of the heat generating components, e.g. the source contacts of a field effect transistor to dissipate heat. However, this complicates the design of the module base, limits the circuit architecture that can be applied to the modular integrated circuit and may compromise then al management.

In summary, while flip chip attachment of RF semiconductor components is often desired for the purpose of eliminating wire bonds and the accompanying ill defined parasitics, it is difficult to draw heat out of the chip in an efficient manner due to the lack of a heat sink on top of the bare silicon carbide substrate.

SUMMARY OF THE INVENTION

Rather than using a flip chip RF connection technique for inputting and extracting RF energy from an RF amplifier, and rather than utilizing wire bonds, in the subject technique a via is formed through the silicon carbide substrate which has its walls metalized. These metalized walls form a transmission-line which contacts a microstrip or other metallization on the top of the gallium nitride layer, with the metalized via offering a vertical transition through the semiconductor chip that serves as a 50 ohm port for the amplifier. The metalized walls of the via thus provides a backside connection that allows RF signals to connect through the back of the semiconductor chip, while at the same time permitting a heat sink to abut the backside of the chip for extracting heat.

As part of the vertical transition, the backside of the silicon carbide is metalized with the exception of a patterned keep away zone around the via. The center conductor of a coaxial transmission-line in the form of a pin is inserted into the metalized via and in one embodiment is cemented into place utilizing a conductive epoxy. The ground braid or outer conductor of the coax end is connected to the metallization surrounding the via, with the coax being provided in one embodiment by a rectilinear coax transmission line manufactured by Nuvotronics, LLC of Radford, Va.

It has been found by proper dimensioning of the via walls and the positioning of the pin relative to the surrounding metallization that the return loss at the connection is minimized, in effect providing a 50 ohm connection to the RF amplifier. In one embodiment in order to provide for the 50 ohm impedance the metalized walls of the via are spaced 100 microns on three sides from the surrounding metallization on the back of the silicon carbide to provide a safe area with the remaining side spaced at 70 microns. The dimension of the internal walls of the via are 100 microns on a side. The pin itself is 100 microns×100 microns.

it has been found that the subject via provides a less than 20 dB return loss across a wide bandwidth from 2 to 18 gigahertz to provide excellent impedance matching.

In order to control the impedance of the vertical, transition transmission line the majority of the impedance matching is done by the patterning of the keep away area so that the input impedance looks like 50 ohms.

In short, by providing a vertical metalized via transition from the base of the silicon carbide through the gallium nitride one provides a good impedance match between a 50 ohm transmission line feeding the bottom of the device and the RF amplifier formed in the gallium nitride, with the 50 ohm impedance existing over a wide bandwidth. The net result is that one can efficiently couple RF energy into and out of an RF power amplifier by utilizing a vertical transition via with the appropriate impedance matching, thus to enable not only RF connections to the RF amplifier but also to take advantage of the thermal conductivity of silicon carbide which contacts a heat sink on its back side to dissipate the heat generated by the transistors.

While the subject invention has been described in terms of silicon carbide, metalized vertical transition vias are useful in any type of high thermal conductivity substrate material to couple impedance matched transmission lines to an RF circuit, while at the same time being able to extract heat.

BRIEF DESCRIPTION OF THE DRAWINGS

These and other features of the subject invention will be better understood in connection with the detailed description in conjunction with the drawings, of which.

DETAILED DESCRIPTION

Figure 1:
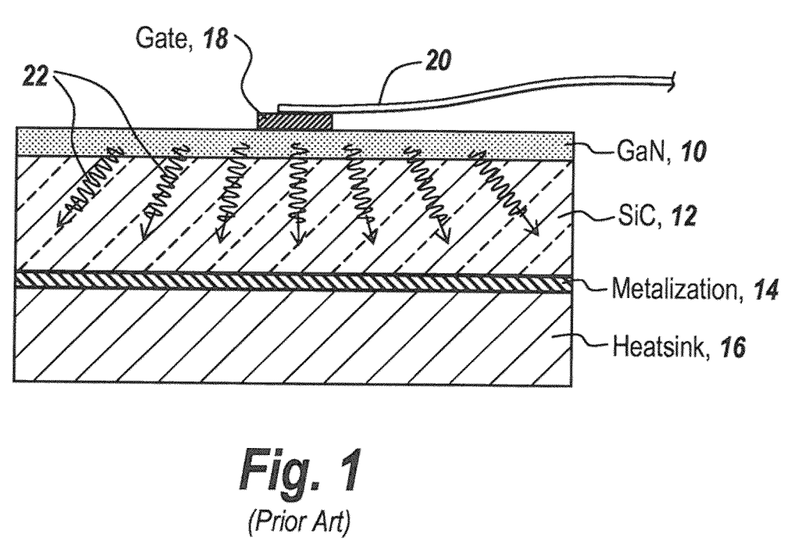
FIG. 1 is a prior art representation of the dissipation of heat from the gate of a GaN/SiC high power RF amplifier, illustrating the dissipation of the heat through a metallization layer to a heat sink, with the gate being wire boarded to an off chip source.

Referring now to FIG. 1, in a prior art configuration involving a die having a GaN layer on top of a silicon carbide substrate, what is shown is a transistor that is patterned onto a gallium nitride layer that is deposited on a silicon carbide substrate 12, which is provided with a metallization layer 14 under which is a heat sink 16 is located.

On top of gallium nitride layer 10 is a gate electrode 18 which is coupled off-die by a wire bond, here generally illustrated by reference character 20.

What will be appreciated that a large majority of the heat from the transistor is generated at gate 18, and as illustrated radiates or dissipates through the silicon carbide substrate as illustrated by arrows 22. This heat dissipates outwardly from the gate area through the metallization area 14 to heat sink 16 which effectively removes or dissipates the heat generated by RF amplifier circuit.

As has been mentioned before, wire bonding is a non optimal method of contacting to the elements of the transistor due to lack of reliability and power loss associated with the variable parasitics that limit the bandwidth performance.

Figure 2:
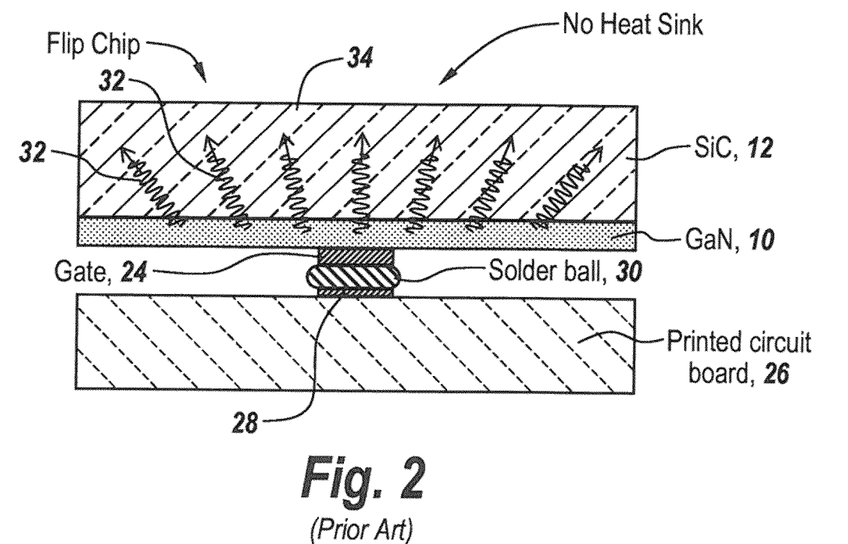
FIG. 2 is a diagrammatic illustration of the dissipation of heat in a flip chip architecture in which heat from a high power amplifier on a GaN/SiC substrate propagates through the silicon carbide to a free air surface of the silicon carbide substrate at which there is no heat sink.

Referring to FIG. 2, in order to effectively couple RF energy into and out of the transistor fabricated with the GaN/SiC architecture a gate 24 is patterned onto gallium nitrite layer 10 that has been previously deposited on silicon carbide substrate 12. As will be appreciated, the gate is soldered to a printed circuit board 26 having a conductive stripe 28 thereon utilizing a solder ball 30 which is part of the flip chip technology in which solder balls are patterned onto various areas before the chip is turned over. Thereafter the solder is melted when the GaN/SiC die is in place.

Here as can be seen at 32 heat efficiently flows through the silicon carbide. However, the dissipated heat ends up at a free-air top surface 34 of the silicon carbide substrate which carries no heat sink. Thus the removal of heat from the RF amplifier stymied at the free air surface, with the die heating up in the absence of a heat sink.

Figure 3:
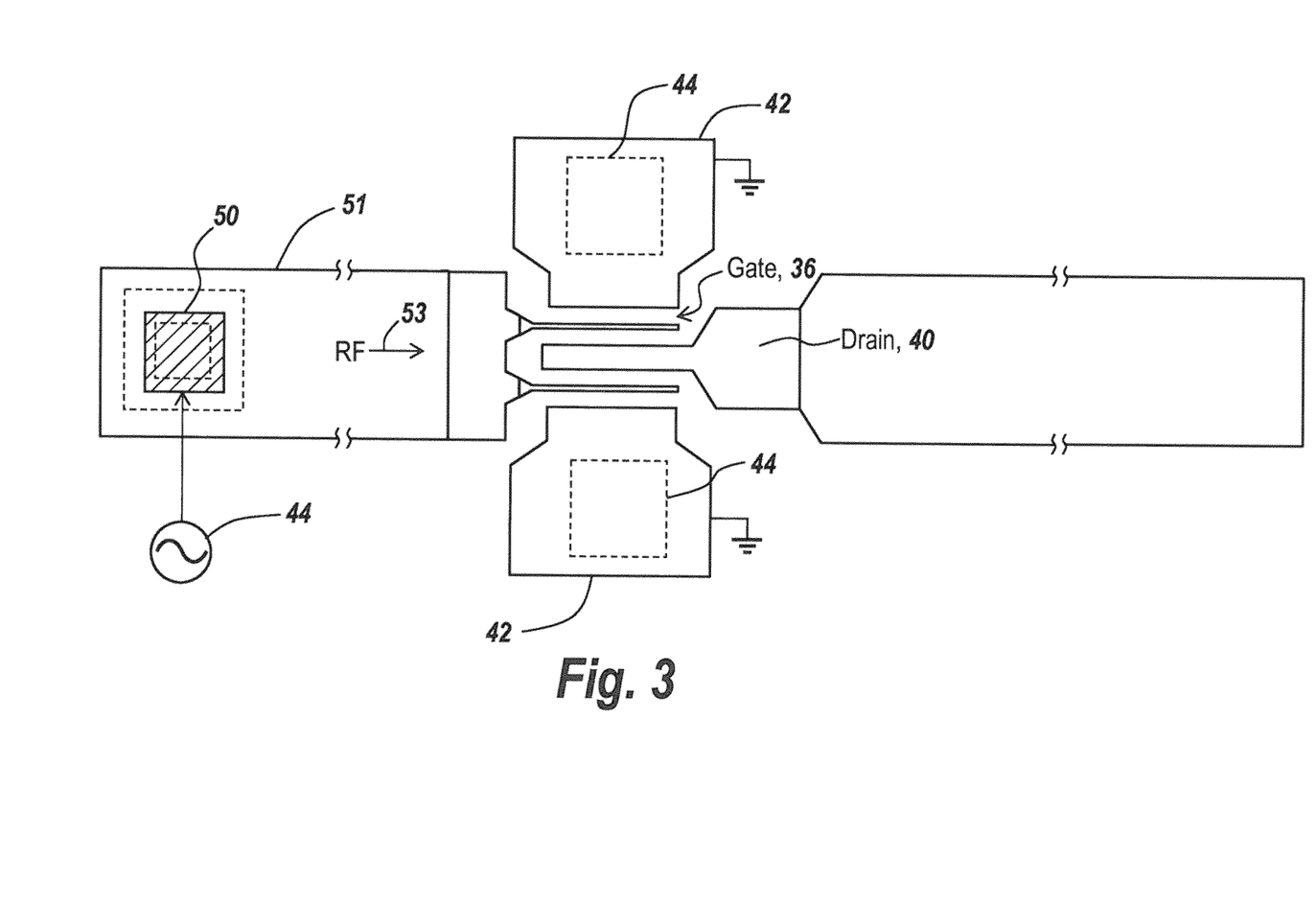
FIG. 3 is diagrammatic illustration of the top surface of a high powered RF amplifier formed into gallium nitride on a SiC substrate, illustrating connection to the gate of the transistor through a metalized vertical transitioning via in the silicon carbide substrate.

Referring to FIG. 3, the outline of a typical high power RF amplifier includes a gate structure 36 with associated fingers surrounding a drain 40, with grounded source electrodes 42 to either side of the gate/drain structure. If an RF signal, as indicated by 44 is applied to a vertically transitioning metalized via 50, then a microstrip or patterned conductor 51 is utilized to convey the energy from the center pin of a coax transmission line in this case to gate structure 36, with the vertically-transitioning wall-metalized via 50 running from the bottom of the silicon carbide substrate 58 up through an etched hole in the gallium nitride layer 56 where it contacts conductor 51 in order to couple RF signals as illustrated at 53 to gate 36.

It will be appreciated that sources 42 may be grounded by a metalized via shown in dotted outline at 44 to the underside of the bottom-metalized silicon carbide substrate to form a dc-connection to the ground plane of the substrate.

It is the purpose of the subject invention to provide an impedance match between a coaxial transmission line, normally a 50 ohm coax to the input and output from the power RF amplifier in such a way as to reduce parasitic problems while at the same time providing an excellent impedance match between the coaxial transmission line and the RF power transistor.

Figure 4:
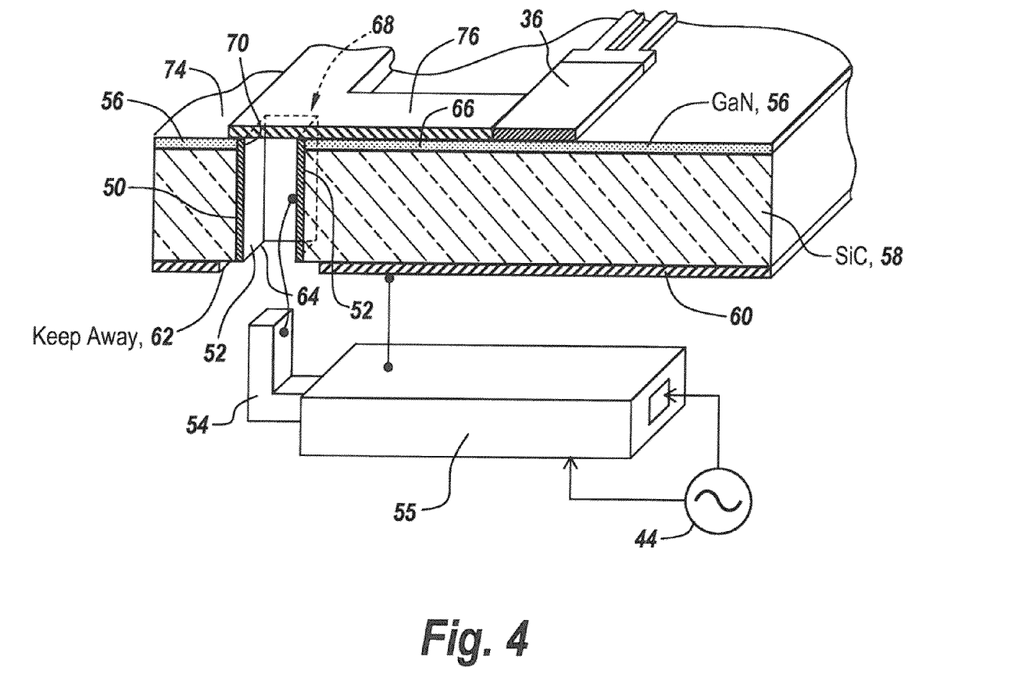
FIG. 4 is a diagrammatic illustration of the connection of a rectilinear coax cable to the gate of an RF amplifier patterned onto a GaN/SiC die showing a vertically transitioning metalized walled via going up through the silicon carbide substrate and through an etched hole in the gallium nitride where a conductive strip on the metallization is connected to the center conductor of the coax and runs to the gate of the high powered RF transistor, also showing a keep away area at the base of the via.

Referring now to FIG. 4, a via 50 is provided with metalized walls 52 into which is inserted a coax pin 54 which is bonded to the interior of wall 52, in one embodiment, with conductive epoxy.

In one embodiment the pin is rectilinear in configuration and extends as the center conductor of a 50 ohm coax transmission line 55 also having a rectilinear configuration which is fed by RF signal 44 as described above.

Here the GaN layer 56 is deposited onto a silicon carbide substrate 58, with a metallization layer 60 patterned onto the bottom of the silicon carbide substrate. However, the patterning of the metallization layer 60 is done in such a way that a keep away zone 62 is provided spaced from the bottom edge 64 of via 50, the purpose of which is to provide 50 ohm impedance.

Here it can be seen that via wall 52 extends out to the top surface 66 of silicon carbide substrate 58 whereupon a hole 68 is etched into the gallium nitrate layer 56. Thereafter the hole is metalized as illustrated at 70 such that there is an electrical conductivity from the metalized lower edge 52 of via 50 up through the silicon carbide substrate and through the gallium nitride layer to a position 74 on top of the silicon carbide layer. The metallization of the etched hole in the GaN layer may be performed concurrently with the patterned metallization on the bottom of the silicon carbide substrate 60. The result is that the microstrip contacts with the top portion of the metalized via through the gallium nitride layer.

As seen, the microstrip is connected to gate electrode 36, whereby connecting gate electrode 36 is coupled to coaxial cable 55 through a 50 ohm port established by the dimensions of the metalized via 50 and the keep away region 62 in the bottom metalized layer 60, as well calculated spacings that are maintained between metalized via 50 and the periphery of keep away region 62.

Figure 5:
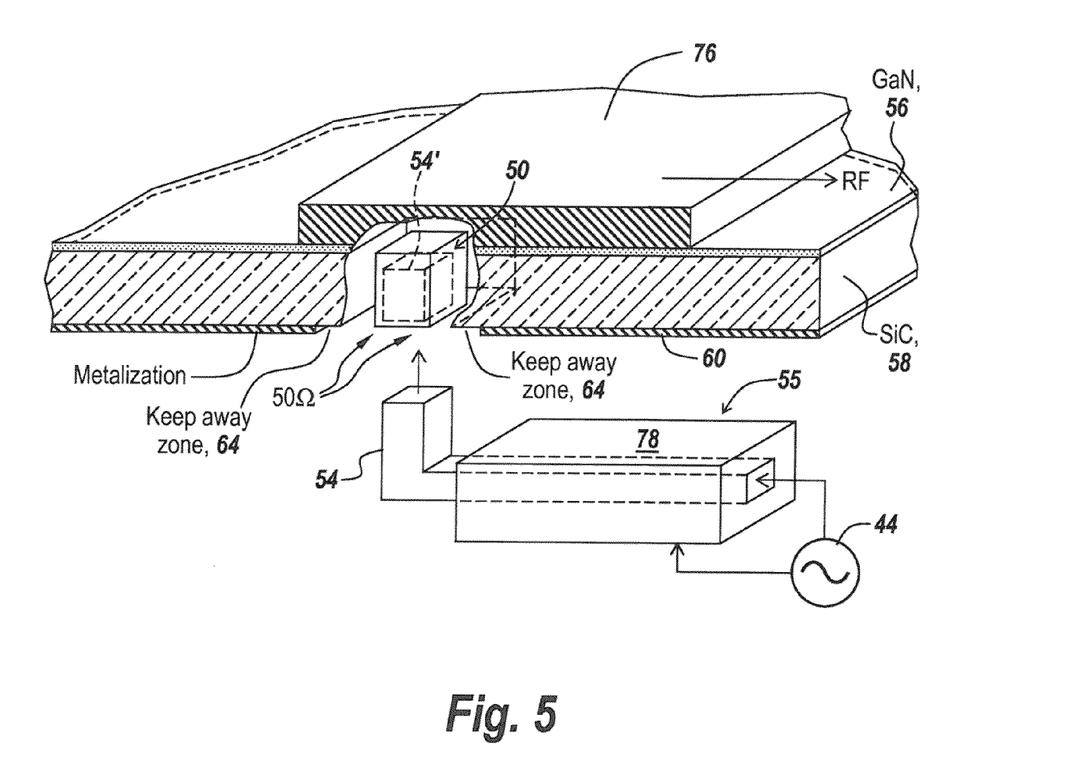
FIG. 5 is a cross-sectional illustration of the connection of a rectilinear coax pin to the metalized walls of the vertical transitioning via, showing the connection of the metalized walls of the via to an overlying metallization on top of the gallium nitride layer, also showing the keep away area which when appropriately patterned results in a 50 ohm port for the device.

Referring to FIG. 5, in more detail the gallium nitride layer 56 on top of the silicon carbide layer 58 is shown provided with the aforementioned bottom metallization layer 60, Here the insertion of pin 54 into the metalized vertically transitioning via 50 is as shown by dotted outline 54'. As can be seen, pin 54 is insertable into via 50, whereas the top surface 78 of coax 54 can be bonded to metallization layer 60 to complete the connection of the coaxial table to the RF power transistor.

Figure 6:
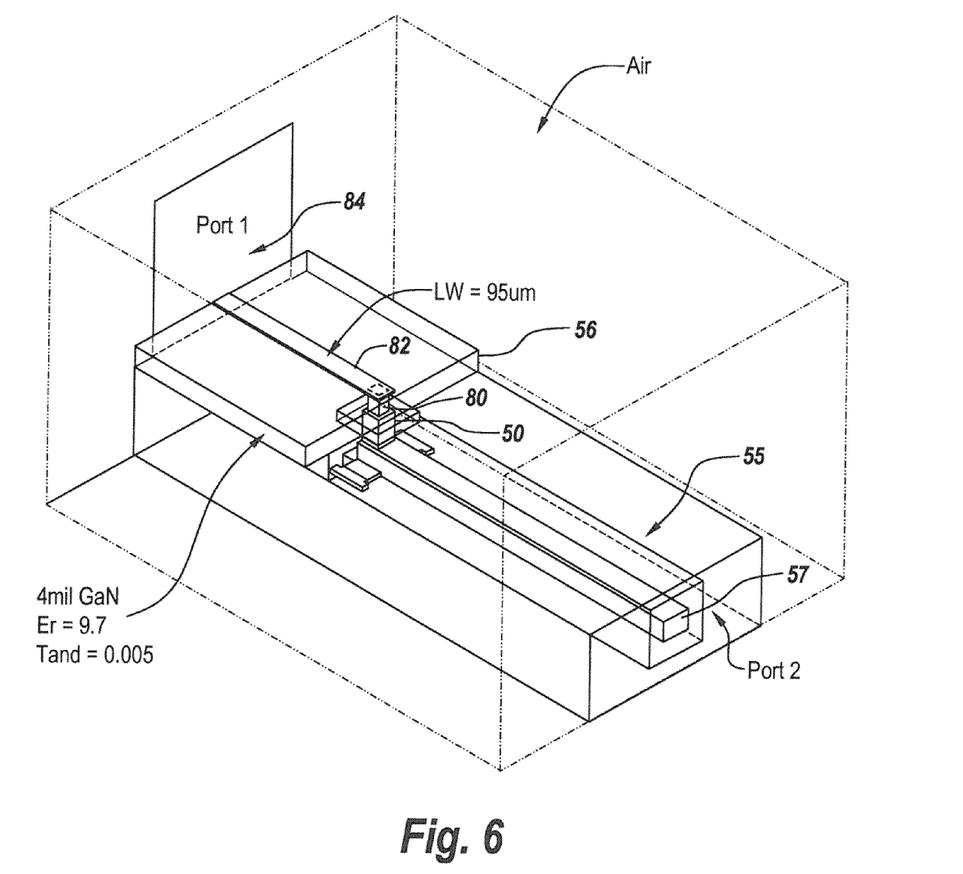
FIG. 6 is a diagrammatic illustration of one embodiment of the subject invention in which a rectilinear coax is connected to a microstrip on top of a gallium nitride layer, deposited over a silicon carbide substrate, illustrating the utilization of the vertical transitioning via to connect to the center pin of the coax to the microstrip.

Referring now to FIG. 6, in one embodiment of the subject invention rectilinear coax 55 is shown having a center conductor 57 that extends outwardly of the proximal end of the coax where it is inserted into vertically transitioning via 50. The top portion of via 50 is coupled to circuits on top of the GaN layer by metalizing a via 80. Through the gallium arsenide layer 56, whereupon electrical connection is made between the center pin of the coax and a microstrip 82 that runs to Port 1 here illustrated at 84.

Figure 7:
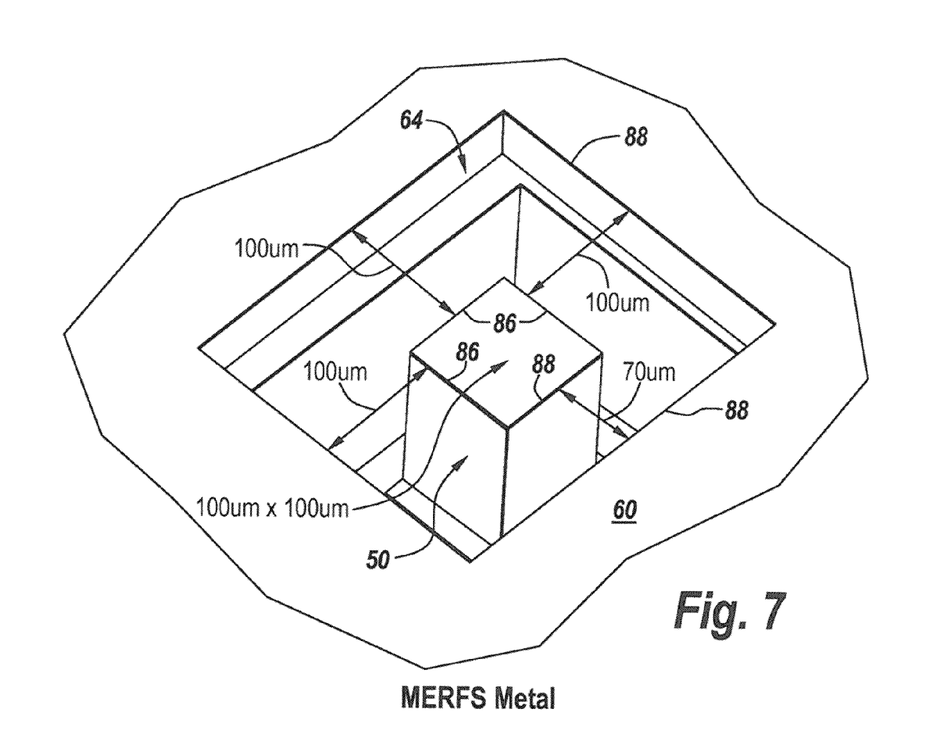
FIG. 7 is a diagrammatic illustration of the spacing of the walls of the vertical via with respect to the keep away metallization at the bottom of the silicon carbide substrate.

As mentioned before, it is the purpose of the vertically transitioning via to present a 50 ohm impedance at the bottom of the silicon carbide layer. In order to do so as illustrated in FIG. 7, which views via 50 from the bottom, via 50 has side walls 86 spaced at 100 microns from the periphery 88 of the keep away region 64, with a via side wall 87 spaced from periphery 88 by 70 microns in one embodiment. This spacing assures a 50 ohm port having return losses less than minus 18 dB across the entire operational bandwidth, of namely from 2 gigahertz to 18 gigahertz.

Figure 8:
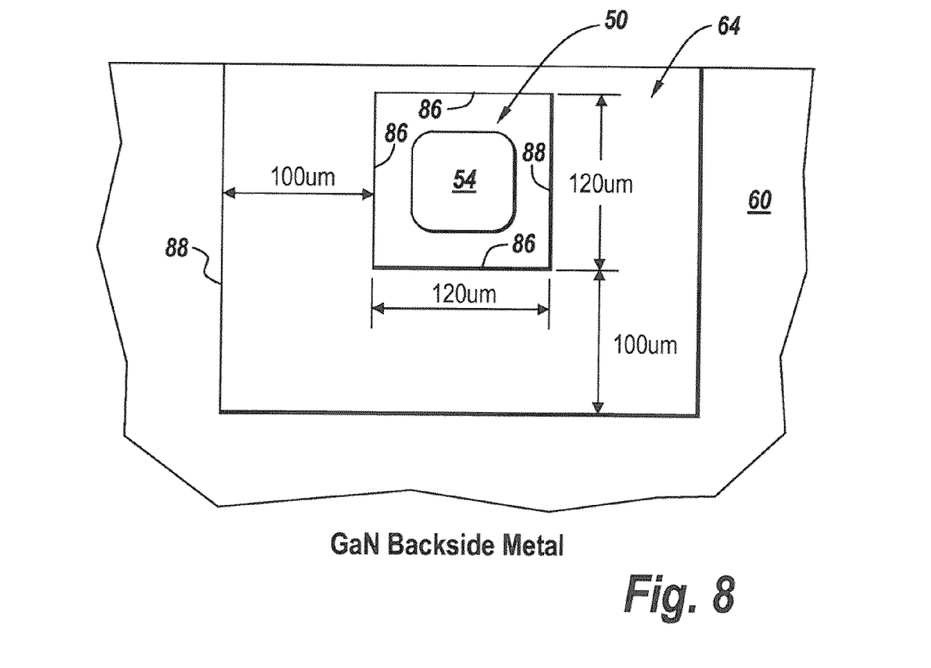
FIG. 8 is a diagrammatic illustration of the dimensions of the metalized via and the spacing of the walls of the metalized via with respect to the keep away region.

Referring to FIG. 8, the vertically extending via 50 has sidewalls 120 microns in width as illustrated at 90. Three of the sidewalls 86 are spaced at 100 microns from periphery 88 of keep away zone 64 in bottom metallization layer 60, with the 100 micron distances of FIG. 7 being shown in FIG. 8. The distance of sidewall 88 to periphery 87 is as illustrated in FIG. 7 via 70 microns.

Figure 9:
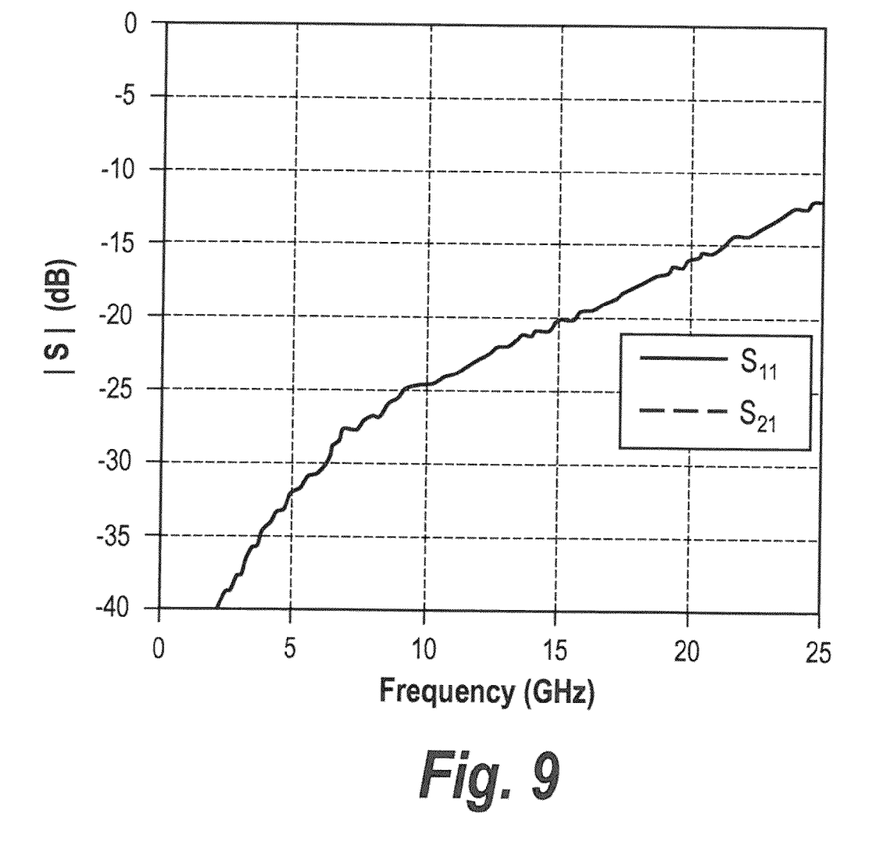
FIG. 9 is a graph of return loss versus frequency illustrating a return loss of less than minus 18 dB, corresponding to VSWR of less of 1.3 to 1 across the entire 2-18 GHz operating range of the subject vertical transitioning via port.

With the above configuration and referring now to FIG. 9 it can be seen that the measured return loss from for instance 2 gigahertz through 18 gigahertz is less than minus 18 dB, meaning that the VSWR at this port is approximately less than 1:3 to 1 to establish a 50 ohm impedance.

Figure 10:
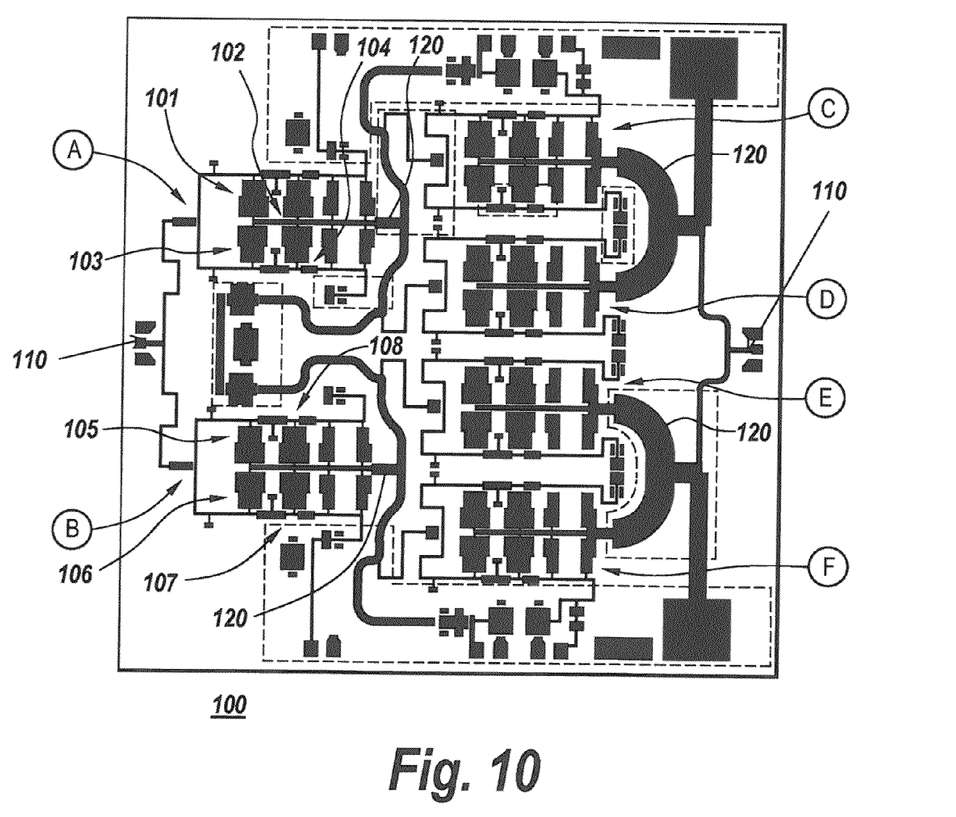
FIG. 10 is a diagrammatic illustration of a high power amplifier die including a large number of transistor amplifiers, each requiring heat dissipation and showing parallel wire bonding to the GaN/SiC die.

Referring to FIG. 10 when a die 100 is provided with numbers of RF amplifying transistors forming a large periphery amplifier MMIC and when the only RF connection to this MMIC is through wire bonds 110, then output power- bandwidth performance is degraded from the parasitic due to wire bonds. However, by replacing the wire bonds with RF connections utilizing a vertical transitioning metalized via through the silicon carbide substrate, one can achieve a proper impedance RF connection with minimal connection parasitic while at the same time effectuating efficient heat removal from the die.

More particularly, die 100 is provided with groups A-F of amplifiers. While each group has tight amplifiers only four are called out for each group. Thus each group has at least the four amplifiers as described in U.S. Pat. No. 8,076,975, assigned to the assignee hereof and incorporated by reference. For instance, Group A has amplifiers 101-104; and Group B has amplifiers 105-108. Groups C, D, F and F are similarly constructed with connections to these amplifiers shown at 120. In one embodiment this die holds 64 amplifying devices and 2 connections to the die facilitated by the subject vertical transitioning metalized vias. Dissipating the heat from 6 amplifying devices is a daunting task but is accomplished with the subject technology which at the same time provides an ideal impedance connection to the amplifiers without using wire bonds.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment but rather construed in breadth and scope in accordance with the recitation of the appended claims.

What is claimed is:

1. In a method of forming a semiconductor RF connection for improved thermal management on a semiconductor chip, wherein the improvement comprises:

forming a vertical transition passing through the semiconductor chip;

connecting RF signals through the back of the semiconductor chip at the vertical transition, enabling backside heat sinking, wherein the back of the chip comprises a patterned metalized layer having a keep away surrounding the base of the vertical transition for impedance matching.

2. The method according to claim 1, wherein the semiconductor chip is a GaN chip.

3. In a semi-conductor device having a high thermal conductivity substrate and a semiconductor layer thereon onto which is patterned a semi-conductor device, a system for providing an RF connection to an electrode associated with said semi-conductor device comprising:

a vertical transition through said high thermal conductivity substrate, said vertical transition including a metalized via through the back side thereof and through said layer, said substrate including a metallization layer on the back side thereof, said metalized layer having a keep away region surrounding the lower end of said via, whereby heat generated at said semiconductor device propagates through said high thermal conductivity substrate and through said metallization layer, such that said metallization layer and said metalized via comprise an RF port for impedance matched transmission of externally generated RF signals through said substrate and said semiconductor layer to said electrode.

4. The system of claim 3, wherein said substrate includes silicon carbide.

5. The system of claim 4, wherein said semiconductor layer includes gallium nitride.

6. The system of claim 3, wherein the impedance of said port is 50 ohms.

7. The system of claim 3, wherein said semiconductor device includes a transistor having a gate electrode and wherein the heat generated by the operation of said transistor occurs in the vicinity of said gate electrode.

8. The system of claim 3, and further including a heat sink in contact with the metallization on the back side of said substrate.

9. The system of claim 3, wherein said metallization layer has a keep away zone surrounding the base of said via and is spaced from the metalized walls of said via by a predetermined distance such that said port has a controllable impedance.

10. The system of claim 9, wherein the metalized walls of said via are in a rectilinear configuration in which two opposed sidewalls and an adjacent sidewall are spaced from the periphery of said keep away zone by a pre-determined distance, and wherein a sidewall opposed to the said adjacent side wall is spaced from the keep away zone periphery by a distance less than that of the distance associated with the other side walls.

11. The system of claim 10, wherein the first of said distances is 100 microns and the second of said distances is 70 microns.

12. The system of claim 11, wherein the width dimension of each of said sidewalls is 120 microns.

13. The system of claim 3, and further including a coaxial transmission line having a central pin conductor that extends therefrom and is adapted to be positioned within said via.

14. The system of claim 13, wherein the sidewalls of said via are rectilinear and wherein said central pin has a rectilinear configuration.

15. The system of claim 14, wherein said rectilinear pin is adapted to be received within the metalized side walls of said via in a tight fit.

16. The system of claim 15, wherein said coaxial transmission line has a rectilinear outer conductor, said rectilinear outer conductor being stripped back from the said central pin and is adapted to contact said metalized layer on the back of said high thermal conductivity substrate when said pin is inserted into said wall-metalized via.

17. The system of claim 3, and further including a patterned metalized strip on top of said semi-conductor layer, said patterned metalized strip overlying said via and in electrical contact with the metalized walls of said via.

18. The system of claim 17, wherein said semiconductor device has an electrode and wherein said patterned metalized strip extends from said via to said electrode.

* * * * *